United States Patent
Nagata et al.

(10) Patent No.: US 6,753,086 B2
(45) Date of Patent: Jun. 22, 2004

(54) THERMOSETTING RESIN COMPOSITION, EPOXY RESIN MOLDING MATERIAL AND SEMICONDUCTOR DEVICE

(75) Inventors: Hiroshi Nagata, Utsunomiya (JP); Yoshiyuki Goh, Kawasaki (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 0 days.

(21) Appl. No.: 10/254,990

(22) Filed: Sep. 25, 2002

(65) Prior Publication Data

US 2004/0058160 A1 Mar. 25, 2004

(51) Int. Cl.$^7$ .............................................. B32B 27/34
(52) U.S. Cl. ................. 428/413; 428/355 EP; 428/901; 523/446; 523/457; 523/458; 523/466; 528/89; 528/104
(58) Field of Search .......................... 428/413, 355 EP, 428/901; 523/446, 466, 457, 458, 400, 924; 528/89, 104, 87; 525/396

(56) References Cited

U.S. PATENT DOCUMENTS 4,395,574 A    7/1983    Doorakian et al.

FOREIGN PATENT DOCUMENTS

| EP | 1 130 041 | | 9/2001 |
|---|---|---|---|
| JP | 2000-7761 | | 1/2000 |
| JP | 2001-64366 A | | 3/2001 |
| JP | 2001-206935 | * | 7/2001 |
| JP | 2002-105171 | | 4/2002 |
| JP | 2002-179768 A | | 6/2002 |

OTHER PUBLICATIONS

Machine Translation, JP 2001–206935, Oka, Jul. 31, 2001.*
Machine Translation, JP–2001–098053, Go et al., Apr. 10, 2001.*

European Search Report, dated Feb. 13, 2003, issued by the European Patent Office, for European Patent Application No. EP02020845.0 (pp. 1–3).

* cited by examiner

Primary Examiner—David J. Buttner
Assistant Examiner—Christpher Keehan
(74) Attorney, Agent, or Firm—Smith, Gambrell & Russell, LLP

(57) ABSTRACT

An epoxy resin molding material which comprises as essential components thereof (A) a compound having at least two epoxy groups in one molecule, (B) a compound having at least two phenolic hydroxyl groups in one molecule, (C) a molecular compound represented by any one of general formulae (1) and (2) and (D) an inorganic filler. The material exhibits an increased curing rate and an excellent storage stability.

General formula (1):

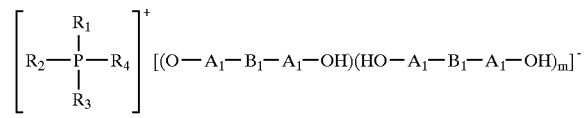

General formula (2):

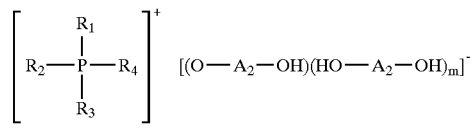

(P represents phosphorus atom, $R_1$, $R_2$, $R_3$ and $R_4$ each represent a substituted or unsubstituted aromatic group or an alkyl group, $A_1$ and $A_2$ each represent a divalent aromatic group, $B_1$ represents a single bond, a divalent group selected from ether groups, sulfone groups, sulfide groups and carbonyl groups or a divaient organic group having 1 to 13 carbon atoms and $0 \leq m \leq 0.75$.)

11 Claims, No Drawings

THERMOSETTING RESIN COMPOSITION, EPOXY RESIN MOLDING MATERIAL AND SEMICONDUCTOR DEVICE

BACKGROUND OF THE INVENTION

1. Field of the Invention

The present invention relates to a thermosetting resin composition which exhibits excellent curing property and storage stability and advantageously used in the electric and electronic fields, an epoxy resin molding material using the composition and a semiconductor device using the material.

2. Description of Related Art

For electric and electronic materials and, in particular, for sealing materials for semiconductors, improvement in the curing rate has been required to increase production efficiency and improvement in storage stability has been required to improve handling during distribution and storage.

In epoxy resins used in the field of electric and electronic materials, amines, imidazole-based compounds, heterocyclic compounds having nitrogen such as diazabicycloundecene, quaternary ammonium compounds, phosphonium compounds, arsonium compounds and the like various compounds have been used as the curing catalyst.

When amines and, in particular, imidazole-based compounds are used for a sealing material for semiconductors, these compounds cause corrosion of internal wiring under a condition of a high temperature and a high humidity, i.e., these compounds tend to show poor reliability under humid conditions, although these compounds exhibit an excellent curing property. Therefore, the use of the above compounds is not desirable in the field of the electric and electronic materials. Phosphorus-based compounds such as phosphonium compounds are widely used in this field.

Many of the widely used curing catalysts exhibit the effect of accelerating curing even at relatively low temperatures such as the ordinary temperature. This effect causes deterioration in the quality of the resin composition. For example, viscosity increases and fluidity decreases during production and storage and the curing property fluctuates.

To overcome the above problem, so-called latent curing accelerators which suppress the change in viscosity and fluidity at low temperatures with time and exhibit the effect of accelerating curing reaction only under heating during molding have been studied widely. For this purpose, studies for exhibition of the latent property by protecting the active site of a curing accelerator with an ion pair have been conducted. In Japanese Patent Application. Laid-Open No. Heisei 8(1996)-41290, a latent curing accelerator having a salt structure formed with an acid selected from various organic acids and phosphonium ion, is disclosed. However, since this phosphonium salt does not have a specific higher order molecular structure and the ion pair is relatively easily susceptible to the influence of the outside environment, a problem arises in that storage stability decreases when this phosphonium salt is applied to recent sealing materials for semiconductors which uses phenol resin curing agents exhibiting greater mobility of molecules such as low molecular weight epoxy resins and phenol aralkyl resins. In Japanese Patent Application Laid-Open No. 2001-98053, a curing accelerator which is a molecular association compound of a tetrasubstituted phosphonium compound, a compound having at least two phenolic hydroxyl groups in one molecule and a conjugate base of the compound having at least two phenolic hydroxyl groups in one molecule, is disclosed. This molecular association compound corresponds to molecular compound (C) represented by general formula (1) or (2) described in the present invention in which m represents 1, However, this molecular association compound has a problem in that the active site in the reaction is strongly protected by the steric hindrance due to the higher order molecular structure and the curing property decreases although the storage stability is excellent.

SUMMARY OF THE INVENTION

The present invention has an object of providing a thermosetting resin composition which exhibits excellent curing property and storage stability and is advantageously used in the field of electric and electronic materials, an epoxy resin molding material using the composition and a semiconductor device exhibiting excellent reliability under humid conditions.

The present invention provides

[1] A thermosetting resin composition which comprises as essential components thereof (A) a compound having at least two epoxy groups in one molecule, (B) a compound having at least two phenolic hydroxyl groups in one molecule and (C) a molecular compound represented by any one of general formula (1) and general formula (2); general formula (1) being:

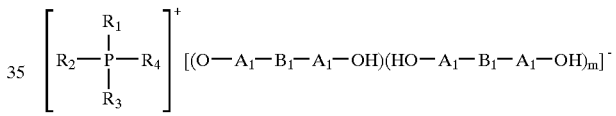

wherein P represents phosphorus atom, $R_1$, $R_2$, $R_3$ and $R_4$ each represent a substituted or unsubstituted aromatic group or an alkyl group, $A_1$ represents a divalent aromatic group, $B_1$ represents a single bond, a divalent group selected from ether groups, sulfone groups, sulfide groups and carbonyl groups or a divalent organic group having 1 to 13 carbon atoms and m represents a number in a range of $0 \leq m \leq 0.75$; and general formula (2) being:

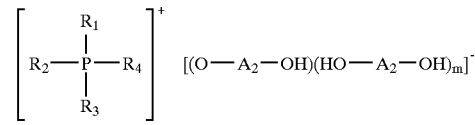

wherein P represents phosphorus atom, $R_1$, $R_2$, $R_3$ and $R_4$ each represent a substituted or unsubstituted aromatic group or an alkyl group, $A_2$ represents a divalent aromatic group and m represents a number in a range of $0 \leq m \leq 0.75$;

[2] An epoxy resin molding material which comprises as essential components thereof (A) a compound having at least two epoxy groups in one molecule, (B) a compound having at least two phenolic hydroxyl groups in one molecule, (C) a molecular compound represented by any one of general formula (1) and general formula (2) and (D) an inorganic filler; general formula (1) being:

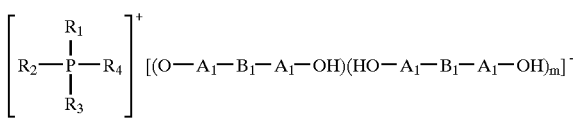

(1)

wherein P represents phosphorus atom, $R_1$, $R_2$, $R_3$ and $R_4$ each represent a substituted or unsubstituted aromatic group or an alkyl group, $A_1$ represents a divalent aromatic group, $B_1$ represents a single bond, a divalent group selected from ether groups, sulfone groups, sulfide groups and carbonyl groups or a divalent organic group having 1 to 13 carbon atoms and m represents a number in a range of $0 \leq m \leq 0.75$; and general formula (2) being:

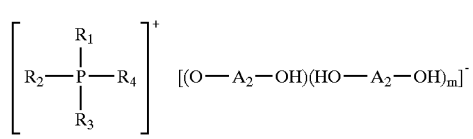

(2)

wherein P represents phosphorus atom, $R_1$, $R_2$, $R_3$ and $R_4$ each represent a substituted or unsubstituted aromatic group or an alkyl group, $A_2$ represents a divalent aromatic group and m represents a number in a range of $0 \leq m \leq 0.75$;

[3] A material described in [2], wherein, in molecular compound (C) represented by any one of general formula (1) and general formula (2), the number represented by m is 0 or 0.5;

[4] A material described in [3], wherein the phenol component in molecular compound (C) represented by general formula (1) is bis(4-hydroxyphenyl) sulfone, 2,2-bis(4-hydroxyphenyl)-1,1,1,3,3,3-hexafluoro-propane or bis(4-hydroxyphenyl) ether; and

[5] A semiconductor device which comprises a semiconductor element sealed with an epoxy resin molding material described in any one of [2], [3] and [4].

An epoxy resin molding material which exhibits remarkably excellent curing property and storage stability can be obtained in accordance with the present invention described above.

DESCRIPTION OF THE PREFERRED EMBODIMENTS

Compound (A) having at least two epoxy groups in one molecule which is used in the present invention is not particularly limited as long as the compound has at least two epoxy groups in one molecule. Examples of compound (A) include epoxy resins and epoxy compounds obtained by reacting epichlorohydrin with hydroxyl group in phenols, phenol resins and naphthols such as epoxy resins of the biphenyl type, epoxy resins of the novolak type and epoxy resins of the naphthalene type; epoxy resins obtained by epoxidation of olefins with peracids such as alicyclic epoxy resins; and compounds obtained by epoxidation of dihydroxybenzenes such as hydroquinone with epichlorohydrin.

Compound (B) having at least two phenolic hydroxyl groups in one molecules works as the curing agent for the compound (A) having at least two epoxy groups in one molecule. Examples of compound (B) include phenol novolak resin, cresol novolak resins, novolak resins modified with alkyl groups (including resins obtained by co-condensation of the double bond of cycloalkenes with phenols in accordance with the Friedel-Crafts reaction), phenol aralkyl resins and resins obtained by co-condensation of naphthols and phenols with compounds having carbonyl group. However, compound (B) is not limited to the compounds described above and any compound in which hydrogen atoms bonded to aromatic rings are substituted with at least two hydroxyl groups in one molecule can be used.

Molecular compound (C) which works as the curing accelerator in the present invention is represented by any one of general formula (1) and general formula (2) and is a molecular association compound of tetrasubstituted phosphonium and a phenol compound. This compound comprises a combination of one tetrasubstituted phosphonium cation, at least one and less than three phenolic hydroxyl groups and one phenoxide anion. It is considered that the positive charge of the tetrasubstituted phosphonium cation is surrounded with at least one and less than three phenolic hydroxyl groups and one phenoxide anion and a stable structure is formed.

As the phosphonium ion which can have the above structure, a tetrasubstituted phosphonium ion having substituted or unsubstituted aryl groups and alkyl groups as the substituents is preferable due to stability against heat and hydrolysis. Examples of the phosphonium ion include tetratolylphosphonium ions such as tetraphenylphosphonium ion and tetratolylphosphonium ion; triarylmonoalkylphosphonium ions synthesized from triarylphosphines and alkyl halides such as triphenylmethylphosphonium ion; and tetraalkylphosphonium ions such as tetrabutylphosphonium ion.

Molecular compound (C) used in the present invention has a structure of the phosphonium-phenoxide salt type as described above. This structure is different from the structure of the conventional compounds of the phosphonium-organic acid anion salt type in that, in molecular compound (C), a higher order structure formed with the hydrogen bonds of protons of the phenolic hydroxyl groups surrounds the ionic bond. In the conventional salt, the reactivity is controlled by the strength of the ionic bond alone. In contrast, in molecular compound (C), the ion pair of the active site of the reaction is surrounded by the higher order structure and protected at the room temperature. In the stage of the actual molding, the higher order structure is decomposed and the active site of the reaction is exposed to exhibit the reactivity. Thus, the so-called latent property can be provided.

Examples of the phenol compound which can, in general, form a molecular compound with the tetrasubstituted phosphonium ion include bisphenols such as bisphenol A (2,2-bis(4-hydroxyphenyl)propane), bisphenol F (4,4'-methylenebisphenol, 2,4'-methylenebisphenol and 2,2-methylenebisphenol), bis(4-hydroxyphenyl) sulfone (bisphenol S), bisphenol E (4,4'-ethybdenebisphenol), bisphenol fluorene (4,4'-(9H-fluoren-9-ylidene)bisphenol), 4,4'-methylidenebis(2,6-dimethylphenol) and bis(4-hydroxyphenyl)methanone; biphenols such as 4,4'-biphenol, 2,2'-biphenol, 3,3',5,5'-tetramethylbiphenol and 2,2-bis(4-hydroxyphenyl)-1,1,1,3,3,3-hexafluoropropane; hydroquinone; resorcinol; catechol; bis(4-hydroxyphenyl) ether; 2,6-dihydroxynaphthalene; 1,4-dihydroxynaphthalene, 2,3-dihydroxynaphthalene; 1,6-dihydroxynaphthalene; 1,1'-bi-2-naphthol; and 1,4-dihydroxyanthraquinone. These compounds can form coordinated structures represented by general formula (1) or general formula (2) in which the number represented by m can be in the range of 0 to 2 depending on the relative amounts of the tetrasubstituted phosphonium ion and the phenol compound and the structure of the phenol compound. In the present invention, phenol compounds are selected among the above compounds so that the number represented by m is in the range of $0 \leq m \leq 0.75$ in the formed coordinated structure represented by general formula (1) or general formula (2). The structures of the tetraphenylphosphonium portion and the phenol portion can be confirmed by the measurement of $^1$H-NMR and the mass spectrum. The value of m in general formula (1) or general formula (2) can be calculated from the integral intensities of the phosphonium portion and the phenol portion obtained by the measurement of $^1$H-NMR of the molecular compound in accordance with the following equation:

$$m=(F_1/F_0)/(P_1P_0)-1$$

wherein $P_0$ and $F_0$ each represent the number of proton in one molecule of the phosphonium cation and $P_1$ and $F_1$ represent the integral values of the phosphonium cation portion and the total phenol portion in the anion side, respectively, which are obtained by the measurement.

The value of m in general formula (1) or general formula (2) representing the molecular compound is decided depending on the stability of phenoxy ion, easiness of hydroxyl group for forming the hydrogen bond, steric hindrance and rigidify of the phenol compound and other factors. It is considered from the steireochemical consideration that m can have discrete values such as 0.0, 0.25, 0.33, 0.5, 0.67, 0.75, 1.0, 1.25, 1.33, 1.5 and so on. Examples of the phenol compound which is preferable for forming the structure represented by general formula (1) or general formula (2) in which the number represented by m is in the range of $0 \leq m \leq 0.75$ include bisphenol S, 2,2-bis(4-hydroxyphenyl)-1,1,1,3,3,3-hexafluoropropane, bis(4-hydroxy-3-methylphenyl) sulfone and bis(4-hydroxyphenyl) ether. There is the possibility that the formed structure is different depending on the relative amounts of the phosphonium compound and the phenol compound used in the synthesis of the molecular compound. When m in general formula (1) or general formula (2) represents a number in the range of $0 \leq m \leq 0.75$, the higher order structure is easily decomposed and a catalyst exhibiting a greater activity of curing the epoxy resin can be obtained. On the other hand, when m in general formula (1) or general formula (2) represents a number of 1 or greater, the protection of the active site of the reaction is strong due to the steric hindrance of the phenol compound and the reactivity at the molding temperature decreases.

Molecular compound (C) can be synthesized in accordance with any of the following processes. In one of the processes, the above phenol compound and a base for helping ultimate removal of a hydrogen halide which is, for example, an alkali metal hydroxide such as sodium hydroxide and potassium hydroxide or an organic base such as pyridine and triethylamine are dissolved into a solvent such as an alcohol, a halide of the above tetrasubstituted phosphonium ion dissolved in a suitable solvent is added, the reaction is allowed to proceed and the object compound is separated as the solid component in accordance with a separating operation such as recrystallization and reprecipitation in the last step. In another process, a tetrasubstituted phosphonium tetrasubstituted borate and the phenol compound are reacted with generation of heat and further reacted in a solvent such as an alcohol under heating.

It is preferable due to the excellent balance of the curing property, the storage property and other properties that the amount of molecular compound (C) used as the curing accelerator in the present invention is in the range of about 0.5 to 20 parts by weight per 100 parts by weight of the total of the amount of compound (A) having at least two epoxy groups in one molecule and the amount of compound (B) having at least two phenolic hydroxyl groups in one molecule which works as the curing agent. As for the relative amounts of compound (A) having at least two epoxy groups in one molecule and compound (B) having at least two phenolic hydroxyl groups in one molecule, it is preferable that the total of the amount by mole of the phenolic hydroxyl group in compound (B) having at least two phenolic groups in one molecule and the amount by mole of the phenolic hydroxyl group in molecular compound (C) is in the range of about 0.5 to 2 moles and preferably in the range of about 0.8 to 1.2 moles per 1 mole of epoxy group in compound (A) having at least two epoxy groups in one molecule since the curing property, heat resistance and electric properties are improved.

The type of the inorganic filler of component (D) used in the present invention is not particularly limited and inorganic fillers conventionally used for sealing materials can be used. Examples of the inorganic filler include fused and crushed silica powder, fused spherical silica powder, crystalline silica powder, secondary aggregated silica powder, alumina, titanium white, aluminum hydroxide, talc, clay and glass fiber. Fused spherical silica powder is preferable. It is preferable that the shape is close to the perfect sphere as much as possible. The spherical silica can be used in an increased amount by using powders having different particle sizes.

It is preferable that the amount of the inorganic filler is in the range of 200 to 2,400 parts by weight per 100 parts by weight of the total of the amount of compound (A) having at least two epoxy groups in one molecule and the amount of compound (B) having at least two phenolic hydroxyl groups in one molecule. When the amount is less than 200 parts by weight, there is the possibility that the effect of reinforcement with the filler is not sufficiently exhibited. When the amount exceeds 2,400 parts by weight, there is the possibility that fluidity of the molding material decreases and defective filling takes place during the molding. Therefore, such amounts are not preferable. It is more preferable that the amount of the inorganic filler is in the range of 250 to 1,400 parts by weight per 100 parts by weight of the total of the amounts by weight of compounds (A) and (B) since the degree of moisture absorption of the product obtained by curing the molding material decreases to prevent formation of cracks in solder and viscosity of the molding material in the melted condition decreases to eliminate the possibility of deforming metal wiring inside the semiconductor device. It is preferable that the inorganic filler is mixed well in advance.

The epoxy resin molding material of the present invention may further comprise various additives in combination with components (A) to (D), where necessary. Examples of the additive include coupling agents such as γ-glycidoxypropyltrimethoxysilane, coloring agents such as carbon black, flame retardants such as brominated epoxy resins, antimony oxide and phosphorus compounds, low stress components such as silicone oils and silicone rubbers, mold release agents such as natural wax, synthetic wax, higher fatty acids, metal salts of higher fatty acids and paraffins and antioxidants. In the present invention, catalysts such as triphenyl-phosphine and 1,8-diazabicyclo(5,4,0)undecene-7,2-methyl-imidazole may be used in combination without any problems as long as the function of molecular compound (C) as the curing accelerator is not adversely affected.

The epoxy resin molding material of the present invention can be obtained by mixing components (A) to (D) and other additives at the room temperature by a mixer, followed by kneading by a mixing machine such as rolls and an extruder, cooling and pulverizing.

In the production of the semiconductor device by sealing electronic parts such as semiconductors using the epoxy resin molding material of the present invention, the molding and curing can be achieved in accordance with the transfer molding, the compression molding or the injection molding.

The semiconductor device prepared by sealing with the cured product of the epoxy resin molding composition of the present invention is included in the technical range of the present invention and exhibits excellent resistance to moisture.

To summarize the advantages obtained by the present invention, the thermosetting resin composition and the epoxy resin molding material of the present invention exhibit excellent curing property and storage stability and the semiconductor device obtained by sealing a semiconductor element with the epoxy resin molding material exhibits excellent reliability;under humid conditions. Therefore, the composition, the material and the device are used industrially advantageously.

EXAMPLES

The present invention will be described more specifically with reference to examples in the following. However, the present invention is not limited to the examples.

Synthesis of Curing Accelerators

The structure of a synthesized molecular compound of component (C) was confirmed in accordance with $^1$H-NMR, the elemental analysis and the neutralizing titration (the measurement of the phosphonium phenoxide equivalent) described in the following.

A synthesized molecular compound of component of component (C) was reacted with oxalic acid in a known excess amount by weight in a mixed solvent of methanol and water. The amount of oxalic acid remaining after the reaction was determined with an aqueous solution of sodium hydroxide having a known concentration by normal and the amount by normal per the unit weight of the molecular compound of component (C) (N/g) was calculated. The reciprocal of the obtained value was used as the phosphonium phenoxide equivalent.

Synthesis Example 1

Into a 1 liter separable flask equipped with a stirrer, 37.5 g (0.15 moles) of BPS-N (manufactured by NIKKA KAGAKU Co., Ltd.; containing 4,4'-bisphenol S as the main component) and 100 ml of methanol were placed and BDS-N was dissolved into methanol under stirring at the room temperature. While the resultant solution was stirred, a solution prepared in advance by dissolving 4.0 g (0.1 mole) of sodium hydroxide into 50 ml of methanol was added and then a solution prepared in advance by dissolving 41.9 g (0.1 mole) of tetraphenylphosphonium bromide into 150 ml of methanol was added. After the resultant solution was further stirred for some time, 300 ml of methanol was added. The solution obtained in the flask was added dropwise into a great amount of water under stirring and white precipitates were obtained. The obtained precipitates were separated by filtration and dried and 66.0 g of white crystals were obtained. The obtained compound will be referred to as C1. From the results of $^1$H-NMR and the mass spectroscopy, it was confirmed that C1 was the object 'compound constituted with the tetraphenyl-phosphonium portion and 4,4'-bisphenol S portion. It was also confirmed from the ratio of the integral intensity of the 4,4'-bisphenol S portion to the intensity of the 'tetraphenylphosphonium portion in $^1$H-NMR that C1 was the object compound in which tetraphenylphosphonium and 4,4'-bisphenol S in relative amounts by mole of 1:1.5 (m=0.5) formed a complex. The value obtained by the neutralizing titration showed that the phosphonium phenoxide equivalent was close to the calculated value of 713 and the result of the elemental analysis supported the above structure. The yield of the synthesis was 92.6%.

Synthesis Examples 2 to 6 and Comparative Synthesis Examples 1 and 2

In Synthesis Examples 2 to 6 and Comparative Synthesis Examples 1 and 2, essentially the same procedures as those conducted in Synthesis Example 1 were conducted in the conditions shown in Table 1 and compounds C2 to C6, D1, and D2, respectively, were prepared. The results are shown in Table 1.

Comparative Synthesis Example 3

Into a 1 liter separable flask equipped with a stirrer, 17.0 g (0.1 mole) of p-phenylphenol and 50 ml of methanol were placed and p-phenylphenol was dissolved into methanol under stirring at the room temperature. While the resultant solution was stirred, a solution prepared in advance by dissolving 4.0 g (0.1 mole) of sodium hydroxide into 50 ml of methanol was added and then a solution prepared in advance by dissolving 41.9 g (0.1 mole) of tetraphenylphosphonium bromide into 150 ml of methanol was added. After the resultant solution was further stirred for some time, 100 ml of pure water was added dropwise into the flask under stirring. Then, 100 ml of 2-propanol was added and white precipitates were obtained. The obtained precipitates were separated by filtration and dried and white crystals were obtained. The obtained compound will be referred to as D3. From the results of the same analyses as those conducted in Synthesis Example 1, it was found that D3 was a compound in which tetraphenylphosphonium was ionically bonded to a phenoxide formed by elimination of proton from hydroxyl group of p-phenylphenol in relative amounts by mole of 1:1. D3 was not the molecular compound used in the present invention but an ordinary phosphonium salt.

Comparative Synthesis Example 4

Into a 1 liter separable flask equipped with a stirrer, 12.2 g (0.1 mole) of benzoic acid and 50 ml of methanol were placed and benzoic acid was dissolved into methanol under stirring at the room temperature. While the resultant solution was stirred, a solution prepared in advance by dissolving 4.0 g (0.1 mole) of sodium hydroxide into 50 ml of methanol was added and then a solution prepared in advance by dissolving 41.9 g (0.1 mole) of tetraphenylphosphonium bromide into 150 ml of methanol was added. After the resultant solution was further stirred for some time, the solution obtained in the flask was added dropwise into 100 ml of water under stirring. Then, 100 ml of 2-propanol was added and white precipitates were obtained. The obtained precipitates were separated by filtration and dried and white crystals were obtained. The obtained compound will be referred to as D4. From the results of the same analyses as those conducted in Synthesis Example 1, it was found that D4 was a compound in which tetraphenylphosphonium was ionically bonded to a carboxylate formed by elimination of proton from carboxyl group of benzoic acid in relative amounts by mole of 1:1. D4 was not the molecular compound used in the present invention but an ordinary phosphonium salt.

The results of Comparative Synthesis Examples are also shown in Table 1.

TABLE 1-1

| | Synthesis Example | | | | | |
|---|---|---|---|---|---|---|
| | 1 | 2 | 3 | 4 | 5 | 6 |
| | Synthesized compound | | | | | |
| | C1 | C2 | C3 | 04 | C5 | C6 |
| Phenol compound constituting molecular compound (C) (amount of OH by mole) | | | | | | |
| BPS-N [1] | 0.3 | | | | | 0.3 |
| 2,2-bis(4-hydroxyphenyl)-1,1,1,3,3,3-hexafluoropropane | | 0.2 | | | | |
| bis(4-hydroxy-3-methylphenyl) sulfone | | | 0.3 | | | |
| bis(4-hydroxyphenyl) ether | | | | 0.2 | 0.3 | |
| bis(4-hydroxyphenyl)methane | | | | | | |
| p-phenylphenol | | | | | | |
| benzoic acid | | | | | | |
| Phosphonium halide (mole) | | | | | | |
| tetraphenylphosphonium bromide | 0.1 | 0.1 | 0.1 | | | |
| tetraphenylphosphonium chloride | | | | 0.1 | | |
| triphenylethylphosphonium bromide | | | | | 0.1 | |
| tetrabutylphosphonium bromide | | | | | | 0.1 |
| Alkali metal hydroxide (mole) | | | | | | |
| sodium hydroxide | 0.1 | | | 0.1 | 0.1 | 0.1 |
| potassium hydroxide | | 0.1 | 0.1 | | | |
| Value of m | 0.5 | 0.0 | 0.5 | 0.0 | 0.5 | 0.5 |
| Phosphonium phenoxide equivalent | | | | | | |
| calculated | 713 | 674 | 755 | 540 | 593 | 633 |
| found [2] | 728 | 668 | 753 | 561 | 598 | 645 |

TABLE 1-2

| | Comparative Synthesis Example | | | |
|---|---|---|---|---|
| | 1 | 2 | 3 | 4 |
| | Synthesized compound | | | |
| | D1 | D2 | D3 | D4 |
| Material used in Comparative Synthesis Example (amount of OH by mole) | | | | |
| BPS-N [1] | | | | |
| 2,2-bis(4-hydroxyphenyl)-1,1,1,3,3,3-hexafluoropropane | | | | |
| bis(4-hydroxy-3-methylphenyl) sulfone | | | | |
| bis(4-hydroxyphenyl) ether | | 0.4 | | |
| bis(4-hydroxyphenyl)methane | 0.4 | | | |
| p-phenylphenol | | | 0.1 | |
| benzoic acid | | | | 0.1 |
| Phosphonium halide (mole) | | | | |
| tetraphenylphosphonium bromide | 0.1 | 0.1 | 0.1 | 0.1 |
| tetraphenylphosphonium chloride | | | | |
| triphenylethylphosphonium bromide | | | | |
| tetrabutylphosphonium bromide | | | | |

TABLE 1-2-continued

| | Comparative Synthesis Example | | | |
|---|---|---|---|---|
| | 1 | 2 | 3 | 4 |
| | Synthesized compound | | | |
| | D1 | D2 | D3 | D4 |
| Alkali metal hydroxide (mole) | | | | |
| sodium hydroxide | 0.1 | 0.1 | 0.1 | 0.1 |
| potassium hydroxide | | | | |
| Value of m | 1.0 | 1.0 | | |
| Phosphonium phenoxide equivalent | | | | |
| calculated | 738 | 742 | 508 | 460 |
| found [2] | 749 | 754 | 522 | 477 |

[1] Manufactured by NIKKA KAGAKU Co., Ltd.
[2] Reciprocal of the amount by normal per the unit weight (N/g) of molecular compound (C) obtained by the neutralizing titration.

Evaluation of Thermosetting Resin Compositions

A synthesized molecular compound of component (C) was added to a compound of component (A) having at least two epoxy groups and a compound of component (B) having at least two phenolic hydroxyl groups and the resultant mixture was pulverized and mixed. After the obtained mixture was kneaded with melting on a heated plate at 100° C. for 5 minutes, the resultant mixture was cooled and pulverized and a sample of a thermosetting resin composition was prepared. The prepared sample was evaluated in accordance with the following methods.

(1) Torque in Curing

The torque of a sample prepared in accordance with the above procedures was obtained by using CURASTOMETER (manufactured by ORIENTECH Co., Ltd.; JSR CURASTOMETER PS type) after 45 seconds at 175° C. The torque obtained using CURASTOMETER is a parameter indicating the curing property. The greater the value, the more excellent the curing property. The unit is kgfcm.

(2) Residual Fraction of Heat Generated by Curing (Evaluation of the Storage Property)

Using a sample prepared in accordance with the above procedures, the initial heat generated by curing immediately after being prepared and the heat generated by curing after storage at 40° C. for 3 days were measured. The residual fraction of the heat generated by curing (mJ/mg) after the storage based on the initial heat generated by curing (mJ/mg) was calculated and expressed as the percentage. The heat generated by curing was measured in accordance with the differential scanning calorimetry at a rate of temperature elevation of 10° C./minute. The greater the obtained value, the more excellent the storage property.

Examples 1 to 6 and Comparative Examples 1 to 5

In Examples 1 to 6 and Comparative Examples 1 to 5, samples of compositions were prepared in accordance with formulations shown in Table 2 using compounds C1 to C6 obtained in Preparation Examples 1 to 6, respectively, and compounds D1 to D4 obtained in Comparative Preparation Examples 1 to 5, respectively, and evaluated in accordance with the procedures described above. In place of molecular compound (C), triphenylphosphine was used in Comparative Example 1 and compounds D1 to D4 prepared in Comparative Examples 1 to 4, respectively, were used in Comparative Examples 2 to 5, respectively. The results of the evaluation of the compositions are shown in Table 2.

TABLE 2-1

| Formulation (part by weight) | Example | | | | | |
|---|---|---|---|---|---|---|
| | 1 | 2 | 3 | 4 | 5 | 6 |
| component (A) | | | | | | |
| EOCN-1020-65 [1] | | | 67 | | | |
| YX-4000H [2] | 52 | 52 | | 52 | 52 | 52 |
| component (B) | | | | | | |
| phenol novolak resin [3] | | | 33 | | | |
| XL-225 [4] | 48 | 48 | | 48 | 48 | 48 |
| molecular compound (C) [5] | | | | | | |
| type | C1 | C2 | C3 | C4 | C5 | C6 |
| amount | 3.7 | 3.5 | 3.8 | 2.8 | 3.3 | 3.3 |
| Properties | | | | | | |
| torque in curing (175° C. 45 s) (kgf·cm) | 0.56 | 0.65 | 0.61 | 0.68 | 0.62 | 0.71 |
| residual fraction of heat generated by curing (%) | 91 | 92 | 95 | 91 | 92 | 90 |

TABLE 2-2

| Formulation (part by weight) | Comparative Example | | | | |
|---|---|---|---|---|---|
| | 1 | 2 | 3 | 4 | 5 |
| component (A) | | | | | |
| EOCN-1020-65 [1] | | | | | 67 |
| YX-4000H [2] | 52 | 52 | 52 | 52 | |
| component (B) | | | | | |
| phenol novolak resin [3] | | | | | 48 |
| XL-225 [4] | 48 | 48 | 48 | 48 | |
| compound replacing component (C) [5] | | | | | |
| type | triphenyl-phosphine | D1 | D2 | D3 | D4 |
| amount | 1.0 | 3.8 | 3.8 | 3.5 | 3.1 |
| Properties | | | | | |
| torque in curing (175° C., 45 s) (kgf·cm) | 0.34 | 0.42 | 0.45 | 0.58 | 0.63 |
| residual fraction of heat generated by curing (%) | 55 | 93 | 95 | 53 | 59 |

[1] A cresol novolak epoxy resin manufactured by NIPPON KAYAKU Co., Ltd.
[2] An epoxy resin of the biphenyl type manufactured by JAPAN EPOXY RESIN Co., Ltd.
[3] A phenol novolak resin having a hydroxyl equivalent of 104 and a softening point of 95° C.
[4] A phenol aralkyl resin manufactured by MITSUI KAGAKU Co., Ltd.
[5] Compounds synthesized in Synthesis Examples and Comparative Synthesis Examples except triphenylphosphine The thermosetting resin compositions of the present invention exhibited excellent curing property and storage property as shown by the results of Examples. In contrast, the resin composition of Comparative Example 1 using triphenylphoshine as the curing accelerator exhibited poor curing property and storage property. The compositions of Comparative Examples 2 and 3 in which the molecular compounds represented by general formula (1) whose m represents 1 were used exhibited a poor curing property. The compositions of Comparative Examples 4 and 5 using the phosphonium salts which were not the molecular compound used in the present invention exhibited a poor storage property although the curing property was excellent.

Evaluation of Epoxy Resin Molding Materials

Example 7

The following components were mixed and the resultant mixture was kneaded at 95° C. for 8 minutes using heated rolls:

| | | |
|---|---|---|
| YX-4000H (manufactured by JAPAN EPOXY RESIN Co., Ltd.; an epoxy resin of the biphenyl type) | 52 | parts by weight |
| XL-225 (manufactured by MITSUI KAGAKU Co., Ltd.; a phenol aralkyl resin) | 48 | parts by weight |
| Molecular compound C | 2.9 | parts by weight |
| Fused spherical silica (the average particle diameter: 15 μm) | 500 | parts by weight |
| Carbon black | 2 | parts by weight |
| Epoxy resin of the brominated bisphenol A resin type | 2 | parts by weight |
| Carnauba wax | 2 | parts by weight |

The resultant mixture was cooled and pulverized and an epoxy resin molding material was obtained. The obtained epoxy resin molding material was evaluated in accordance with the following methods. The results are shown in Table 3.

Methods of the Evaluation (1) The spiral flow was measured by using a mold for measuring the spiral flow in accordance with the method of EMMI-I-66 at a mold temperature of 175° C., an injection pressure of 70 kg/cm$^2$ and a curing time of 2 minutes. The spiral flow is a parameter showing the fluidity. The greater the value of the spiral flow, the more excellent the fluidity. The unit is cm.

(2) The torque in curing was obtained by using CURAS-TOMETER (manufactured by ORIENTECH Co., Ltd.; JSR CURASTOMETER IVPS type) after 45 seconds at 175° C. The greater the value, the more excellent the curing property. The unit is kgf.cm.

(3) The residual fraction of flow was obtained by measuring the spiral flow immediately after being prepared and after being stored at 30° C. for 1 week and expressed as the percentage of the spiral flow after being stored based on the spiral flow immediately after being prepared. The unit is %.

(4) The reliability under humid conditions was measured in accordance with the following procedures. A 16 pDIP was prepared by molding at a mold temperature of 175° C., a pressure of 70 kg/cm$^2$ and a curing time of 2 minutes. After the molded product was post-cured at 175° C. for 8 hours, a voltage of 20 V was applied to the 16 pDIP in steam at a temperature of 125° C. under a relative humidity of 100% and the product was examined with respect to the broken wiring. The time before the broken wiring was found in 8 or more packages among 15 packages was used as the defect time. The unit is hour. The maximum time of the measurement was 500 hours. When the number of the defective package after 500 hours was 7 or less, the defect time was expressed as 500 hours or longer. The longer the defect time, the more excellent the reliability under humid conditions.

Examples 8 and 9 and Comparative Examples 6 to 10

In Examples 8 and 9 and Comparative Examples 6 to 10, epoxy resin molding materials were prepared using the formulations shown in Table 3 and evaluated in accordance with the same procedures as those conducted in Example 7. The results are shown in Table 3.

TABLE 3-1

| | Example | | |
|---|---|---|---|
| | 7 | 8 | 9 |
| Formulation (part by weight) | | | |
| component (A) | | | |
| YX-4000H [1] | 52 | 52 | 52 |
| component (B) | | | |
| XL-225 [2] | 48 | 48 | 48 |
| component (C) | | | |
| type | C1 | C2 | C6 |
| amount | 2.9 | 2.9 | 2.6 |
| component (D) (fused spherical silica) | 500 | 500 | 500 |
| other components | | | |
| carbon black | 2 | 2 | 2 |
| epoxy resin of the brominated bisphenol A type | 2 | 2 | 2 |
| carnauba wax | 2 | 2 | 2 |
| Properties | | | |
| spiral flow (cm) | 105 | 103 | 108 |
| torque in curing (kgf·cm) | 80 | 83 | 84 |
| residual fraction of flow (%) | 84 | 86 | 88 |
| reliability under humid condition (hour) | >500 | >500 | >500 |

TABLE 3-2

| | Comparative Example | | | | |
|---|---|---|---|---|---|
| | 6 | 7 | 8 | 9 | 10 |
| Formulation (part by weight) | | | | | |
| component (A) | | | | | |
| YX-4000H [1] | 52 | 52 | 52 | 52 | 52 |
| component (B) | | | | | |
| XL-225 [2] | 48 | 48 | 48 | 48 | 48 |
| compound replacing component (C) | | | | | |
| type | triphenyl phosphine | D1 | D2 | D3 | D4 |
| amount | 0.8 | 3.0 | 3.0 | 3.0 | 3.0 |
| component (D) (fused spherical silica) | 500 | 500 | 500 | 500 | 500 |
| other components | | | | | |
| carbon black | 2 | 2 | 2 | 2 | 2 |
| epoxy resin of the brominated bisphenol A type | 2 | 2 | 2 | 2 | 2 |
| carnauba wax | 2 | 2 | 2 | 2 | 2 |
| Properties | | | | | |
| spiral flow (cm) | 73 | 110 | 106 | 71 | 74 |
| torque in curing (kgf·cm) | 32 | 69 | 71 | 83 | 80 |
| residual fraction of flow (%) | 58 | 85 | 87 | 67 | 67 |
| reliability under humid condition (hour) | >500 | >500 | >500 | >500 | 350 |

[1] An epoxy resin of the biphenyl type manufactured by JAPAN EPOXY RESIN Co., Ltd.
[2] A phenol aralkyl resin manufactured by MITSUI KAGAKU Co., Ltd.

The epoxy resin molding materials of Examples 7 to 9 of the present invention exhibited remarkably excellent storage property and curing property. It is also shown that the semiconductor devices sealed with the cured products of these epoxy resin molding materials exhibited excellent resistance to moisture. In contrast, the epoxy resin molding materials of Comparative Examples 6 to 10 exhibited the curing property, the fluidity, the storage property or the reliability under humid conditions inferior to that of the epoxy resin molding materials of Examples 7 to 9.

What is claimed is:

1. A thermosetting resin composition which comprises as essential components thereof (A) a compound having at least two epoxy groups in one molecule, (B) a compound having at least two phenolic hydroxyl groups in one molecule and (C) a molecular compound of a tetrasubstituted phosphonium and a phenol compound represented by any one of formula (1) and formula (2);

formula (1) being:

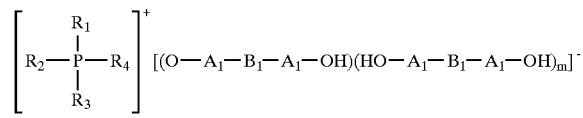

(1)

wherein P represents phosphorus atom, $R_1$, $R_2$, $R_3$ and $R_4$ each represent a substituted or unsubstituted aromatic group or an alkyl group, $A_1$ represents a divalent aromatic group, $B_1$ represents a single bond, a divalent group selected from the group consisting of ether groups, sulfone groups, sulfide groups, carbonyl groups and a divalent organic group having 1 to 13 carbon atoms and m is 0.5; and formula (2) being:

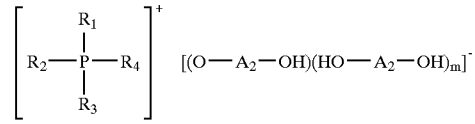

(2)

wherein P represents phosphorus atom, $R_1$, $R_2$, $R_3$ and $R_4$ each represent a substituted or unsubstituted aromatic group or an alkyl group, $A_2$ represents a divalent aromatic group, and m is 0.5.

2. An epoxy resin molding material which comprises as essential components thereof (A) a compound having at least two epoxy groups in one molecule, (B) a compound having at least two phenolic hydroxyl groups in one molecule, (C) a molecular compound of a tetrasubstituted phosphonium and a phenol compound represented by any one of formula (1) and formula (2) and (D) an inorganic filler;

formula (1) being:

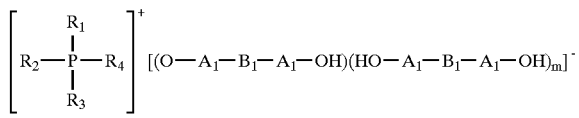

(1)

wherein P represents phosphorus atom, $R_1$, $R_2$, $R_3$ and $R_4$ each represent a substituted or unsubstituted aromatic group or an alkyl group, $A_1$ represents a divalent aromatic group, $B_1$ represents a single bond, a divalent group selected from the group consisting of ether groups, sulfone groups, sulfide groups, carbonyl groups and a divalent organic group having 1 to 13 carbon atoms and m is 0.5; and formula (2) being:

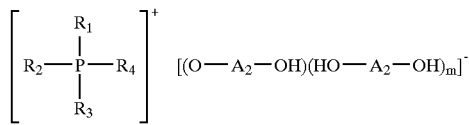

(2)

wherein P represents phosphorus atom, $R_1$, $R_2$, $R_3$ and $R_4$ each represent a substituted or unsubstituted aromatic group or an alkyl group, $A_2$ represents a divalent aromatic group and m is 0.5.

3. A material according to claim 2, wherein the phenol compound which forms a molecular compound (C) is bis(4-hydroxyphenyl) sulfone, 2,2-bis(4-hydroxyphenyl)-1,1,1,3,3,3-hexafluoro-propane or bis(4-hydroxyphenyl) ether.

4. A semiconductor device which comprises a semiconductor element sealed with an epoxy resin molding material according to claim 2.

5. A semiconductor device which comprises a semiconductor element sealed with an epoxy resin molding material according to claim 3.

6. The thermosetting resin composition according to claim 1 wherein compound (A) is an epoxy compound attained by reacting epichlorohydrin with a hydroxy group in a phenol, phenol resin and naphthols, biphenyl epoxy resins, novolak epoxy resins, naphthalene epoxy resins and epoxy resins obtained by epoxidation of olefins with peracids and compounds obtained by epoxidation of dihydroxy benzene with epichlorohydrin.

7. The thermosetting resin composition according to claim 1, wherein compound (B) is a member selected from a group consisting of phenol novolak resins, cresol novolak resins, novolak resins modified with alkyl groups, phenol aralkyl resins and resins obtained by co-condensation of naphthols and phenols with a compound having a carbonyl group.

8. The thermosetting resin composition according to claim 1, wherein the tetrasubstituted phosphonium ion is a member selected from the group consisting of tetraphenylphosphonium ion, tetratolylphosphonium ion, triarylmonoalkyl phosphonium ion synthesized from triarylphosphines and alkyl halides, and tetraalkylphosphonium ion.

9. The thermosetting resin composition according to claim 1, wherein the phenol compound which forms a molecular compound with the tetra substituted phosphonium ions is a member selected from the group consisting of bisphenol A (2,2-bis(4-hydroxyphenyl)propane), bisphenol F (4,4'-methylenebisphenol, 2,4'-methylenebisphenol and 2,2-methylenebisphenol), bis(4-hydroxyphenyl) sulfone (bisphenol S), bisphenol E (4,4'-ethylidenebisphenol), bisphenol fluorene (4,4'-9H-fluoren-9-ylidene) bisphenol, 4,4'-methylidenebis(2,6-dimethylphenol) and bis(4-hydroxyphenyl)methanone; 4, 4'-biphenol, 2,2'-biphenol, 3,3',5,5'-tetamethylbiphenol and 2,2-bis(4-hydroxyphenyl)-1,1,1, 3,3,3-hexafluoropropane; bihydroquinone; resorcinol; catechol; bis(4-hydroxyphenyl) ether; 2,6-dihydroxynaphthalene; 1,4-dihydroxynaphtalene, 2,3-dihydroxynaphthalene; 1,6-dihydroxynaphthalene; 1,1'-bi-2-naphthol; and 1,4-dihydroxyanthraquinone.

10. The epoxy resin molding material according to claim 2, wherein the inorganic filler is a member selected from the group consisting of fused and crushed silica powder, fused spherical silica powder, crystalline silica powder, secondary aggregated silica powder, alumina, titanium white, aluminum hydroxide, talc, clay and glass fiber.

11. The epoxy resin molding material according to claim 2, wherein the amount of inorganic filler is in the range of 250 to 1400 parts by weight per 100 parts by weight of the total of the amounts by weight of compounds (A) and (B).

* * * * *